United States Patent [19]

Kasai

[11] Patent Number: 5,055,844
[45] Date of Patent: Oct. 8, 1991

[54] DIGITAL TO ANALOG CONVERTER

[75] Inventor: Kazuhiko Kasai, Tokyo, Japan

[73] Assignee: Kabushiki Kaisha Toshiba, Kanagawa, Japan

[21] Appl. No.: 343,639

[22] Filed: Apr. 27, 1989

[30] Foreign Application Priority Data

Apr. 28, 1988 [JP] Japan .................. 63-106534

[51] Int. Cl.⁵ .................. H03M 1/66; H03M 1/06; H03M 1/76
[52] U.S. Cl. .................. 341/144; 341/118; 341/135; 341/136
[58] Field of Search .............. 341/144, 135, 118, 136

[56] References Cited

U.S. PATENT DOCUMENTS 4,331,892 5/1982 Miskin et al. .................. 341/118 X
4,827,260 5/1989 Sugawa et al. .................. 341/144 X

FOREIGN PATENT DOCUMENTS 0095623 5/1986 Japan .................. 341/135

Primary Examiner—A. D. Pellinen
Assistant Examiner—Sharon D. Logan
Attorney, Agent, or Firm—Finnegan, Henderson, Farabow, Garrett, and Dunner

[57] ABSTRACT

A digital-to-analog converter which has an input terminal for receiving first and second digital signals and a reference voltage generating circuit for establishing a reference voltage at a control terminal of a reference voltage transistor. The digital-to-analog converter also includes first and second current sources which each include a current source transistor having a control terminal connected to the control terminal of the voltage reference transistor. A first switch connected in the conduction path of the first current source transistor selectively allows current to flow to the output terminal and a second switch connected in the conduction path of the second current source transistor selectively allows a second current to flow to the output terminal.

5 Claims, 4 Drawing Sheets

DIGITAL TO ANALOG CONVERTER

BACKGROUND OF THE INVENTION

1. Field of the Invention

The present invention generally relates to a digital-to-analog converter circuit, which may be used in a variety of applications, including image processing.

2. Description of the Prior Art

FIG. 1 is a circuit diagram of a conventional current-type digital-to-analog converter (d/a converter). The d/a converter includes a plurality of subcircuits 10, each of which comprises a switch 12 and a reference current source 14 connected in series. A first terminal of each switch 12 is connected to a respective reference current source 14, and all of the switches 12 in the subcircuits 10 are commonly connected at their second terminals to the output terminal OUT. Switches 12 are selectively turned on and off by the application of various combinations of digital input signals (see FIG. 2 DATA. input). The current value of each current source 14 is predetermined and the summation of these currents is taken out as the analog output voltage produced across load resistor 16.

A conventional d/a converter comprising reference voltage generating circuits and p-channel MOS transistors will now be described with reference to FIG. 2. In FIG. 2 a plurality of digital-to-analog circuits 18-1, 18-2, and 18-3 are connected to a reference voltage generating circuit 20. Each digital-to-analog circuit has a plurality of subcircuits 22, each comprised of a current source 24 and a switching transistor 26. The circuits receive a digital input DATA which controls the switching transistor 26 and provide an analog output either 0 current or some predetermined value of current. The currents are summed and outputted at terminal OUT as the analog output.

The predetermined current which flows through each subcircuit 22 is determined by current mirror circuits which are comprised of transistor 28 respectively combined with transistor 24 in each subcircuit 22. Transistor 28, the reference voltage transistor, operates as an input element of the current mirror circuit and transistor 24, the current source transistor, operates as an output element. Thus, a number of current mirror circuits are formed with the single transistor 28 operative as the reference voltage transistor in each of the circuits. A reference voltage VREF is provided for the current mirror circuits using voltage source E. Transistor 28 of reference voltage generating circuit 20 is connected to respective d/a circuits 18-1, 18-2, and 18-3 by wiring which introduces additional wiring resistance and capacitance. The wiring resistance and capacitance is indicated by resistances 54 and 56 and the additional capacitance is indicated by capacitances 34 and 36.

When the above described conventional current mirror circuit is applied to CRT image processing, three d/a converters, i.e., 18-1 through 18-3, are used for RGB. To generate a reference voltage VREF for each of the d/a converters, only a single transistor 28 of reference voltage generating circuit 20 is employed. The use of but a single transistor 28 in connection with current sources 24 has disadvantages when used with the plurality of d/a converters 18-1 through 18-3.

In FIG. 2 the conventional circuit is shown with the reference voltage generating circuit 20 set apart and separate from the d/a converters 18-1 through 18-3. The reference voltage generating circuit 20 includes the reference voltage generating P-channel MOS transistor 28, an operational amplifier 30, and a resistor 32. This is a normal pattern layout for such a circuit. Therefore, reference voltage generating transistor 28 is located at a distance from the reference current source transistors 24 within each of the d/a converters 18-1, 18-2, and 18-3. Also, transistor 28 is powered, because of its location, from power source E through different power source lines than for transistors 24. As a consequence, the wiring impedance of the power source line for transistor 28 differs from that of the power source lines for the respective transistors 24, thereby resulting in application of a different power source potential to transistor 28 than to the other transistors 24. The difference in source potential applied to transistors 28 and 24 results in different gate to source voltages VGS. The results of such differences in gate to source voltages VGS is shown in FIG. 3. The values of drain currents IDS for two MOS transistors are shown to be different when the gate to source voltage VGS differs. Since the drain currents IDS must be identical for proper operation of the current mirror circuits, such a difference results in errors in the basic current values generated within the d/a converters 18-1, 18-2, and 18-3.

Because of the above-described problem, in the conventional circuit the output linearity characteristics of the d/a converters 18-1 to 18-3 are adversely affected. FIG. 4 shows as an example an acceptable error range of the d/a converter output level to be plus or minus ¼ LSB from the ideal characteristic curve 48. This range is shown by lines 38 and 40. The output level of conventional prior art circuits, which are effected by differing line impedances and is shown by curve 44, is shown falling outside the acceptable error range when the value of the d/a converter input data becomes large. On the other hand, the output level of the preferred embodiment of the invention, which eliminates the wiring impedance problem, falls within the acceptable error range across a wider range of d/a converter input data values. This is shown schematically by line 42 which can be contrasted with what a typical characteristic 44 of the prior art is likely to be.

SUMMARY OF THE INVENTION

Accordingly, it is an object of the present invention to provide an improved digital to analog converter at high digital input level.

It is a further object of the present invention to provide a digital to analog converter which can provide an accurate analog output regardless of the level of the digital input.

In accordance with the present invention, the foregoing objects, among others, are achieved by providing a digital-to-analog converter having an input terminal for receiving first and second digital signals, a reference voltage generating circuit which has a reference voltage transistor for establishing a reference voltage at a control terminal of the transistor in correspondence with the current through the transistor, first and second current sources respectively including first and second current source transistors which each have a conduction path and a control terminal connected to the control terminal of the voltage reference transistor, a first switch connected in the conduction path of the first current source transistor for selectively allowing a current to flow to the output terminal and a second switch connected in the conduction path of the second current source transistor for selectively allowing a current to flow to the output terminal, wherein the voltage reference transistor is adjacent one or both of the first and second transistors.

Other objects, features, and advantages of the present invention will become apparent from the following detailed description. It should be understood, however, that the detailed description and specific examples, while indicating preferred embodiments of the invention, are given by way of illustration only since various changes, modifications, within the spirit and scope of the invention, will become apparent from those skilled in the art from this detailed description.

BRIEF DESCRIPTION OF THE DRAWINGS

A more complete appreciation of the present invention and many of its attendant advantages will be readily obtained by reference to the following detailed description considered in connection with the accompanying drawings, in which.

DETAILED DESCRIPTION OF THE PREFERRED EMBODIMENT

The preferred embodiment of the present invention will now be described with reference to the accompanying drawings.

Figure 2:
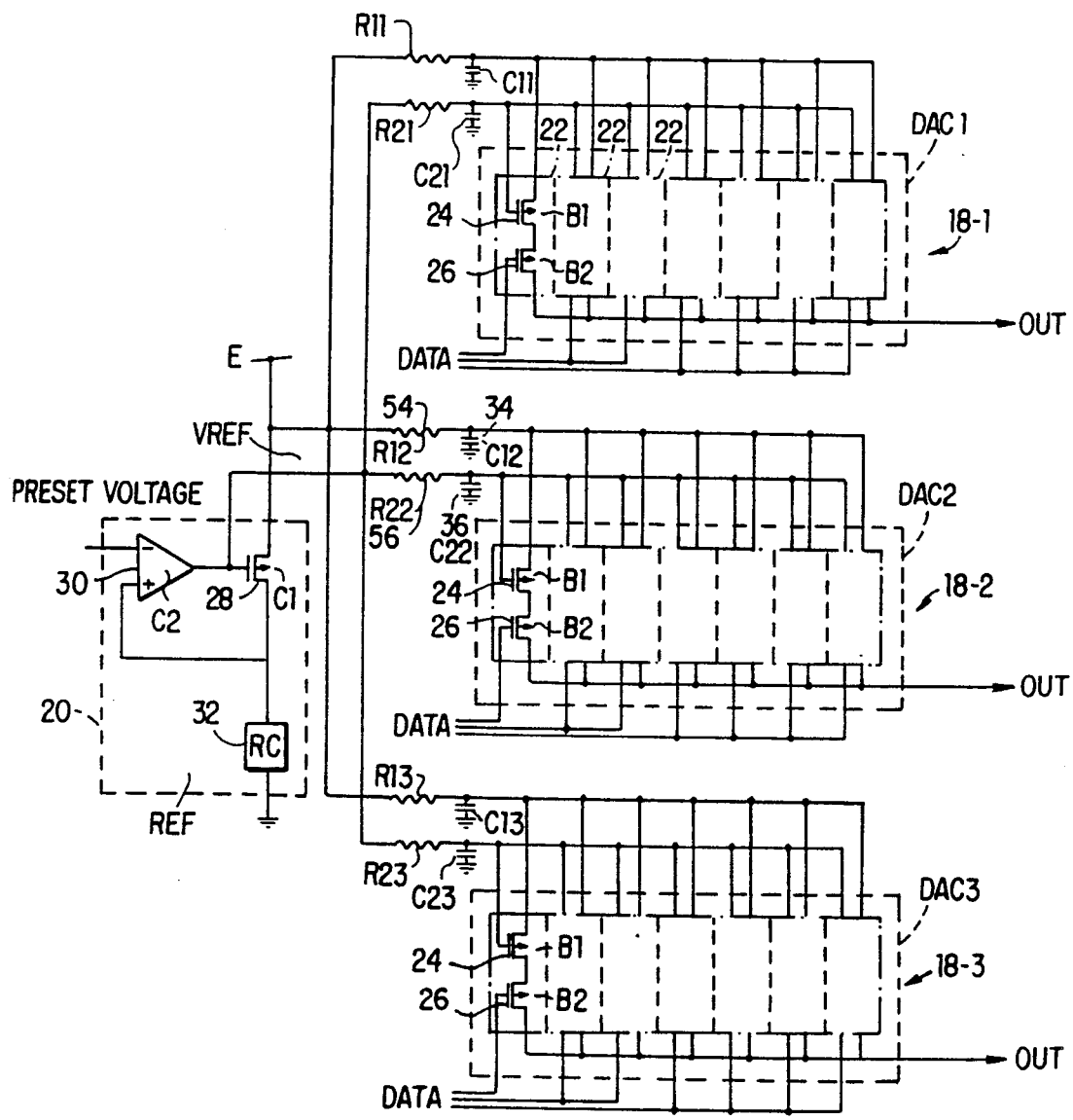
FIG. 2 is a circuit diagram of a prior art digital-to-analog converter.
Figure 5:
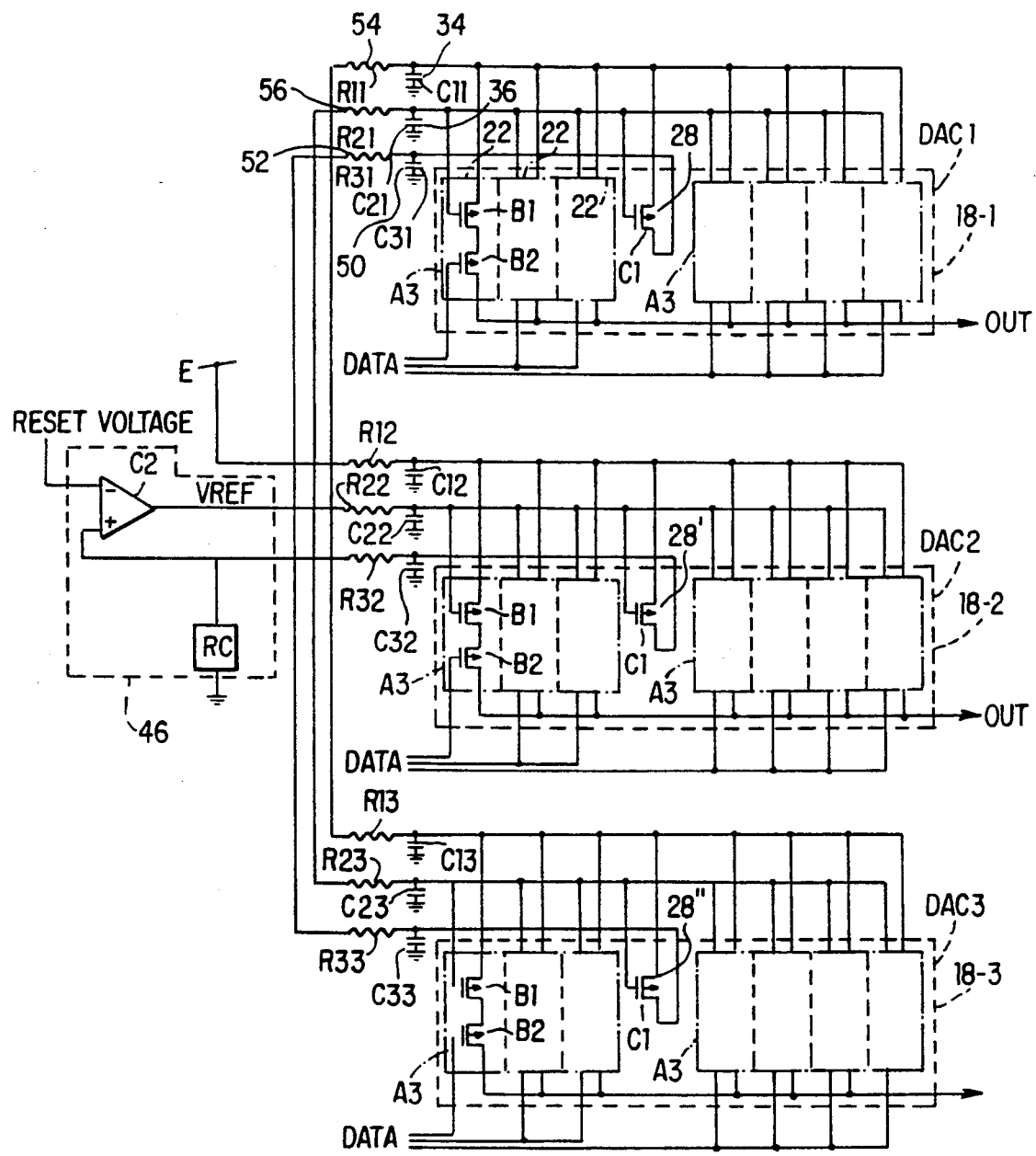
FIG. 5 is a circuit diagram of a preferred embodiment of the present invention.

FIG. 5 shows a circuit diagram of the preferred embodiment of the invention. Those portions of the circuit which are the same as described in the prior art circuit of FIG. 2 are identified by the same symbols and will not be described again. In the present invention, in order to eliminate the disadvantages of the prior art, the input-element side transistor 28 is physically located separate from reference voltage generating circuit 46. Thus, the pattern layout of the circuitry differs from that of the prior art of FIG. 2. Furthermore, each d/a converter 18-1, 18-2, and 18-3 respectively has its own input-element side transistor 28, 28', and 28". For instance, in d/a converter 18-1, transistor 28 is located adjacent the subcircuits 22 of d/a converter 18-1. This allows the source terminals of transistor 28 and the transistors 24, in each of the subcircuits 22 to be connected to the same power source line. Thus, the line conditions for the source supply potential is the same for all of the transistors within the d/a converter 18-1. The impedance for the source supply potential, resistance 54 and capacitance 34, is the same for each transistor. When a number of d/a converters such as 18-1, 18-2 and 18-3 are employed, a separate reference voltage generating transistor 28, 28' and 28" is provided, thus providing the advantages to each of the d/a converters.

Figure 4:
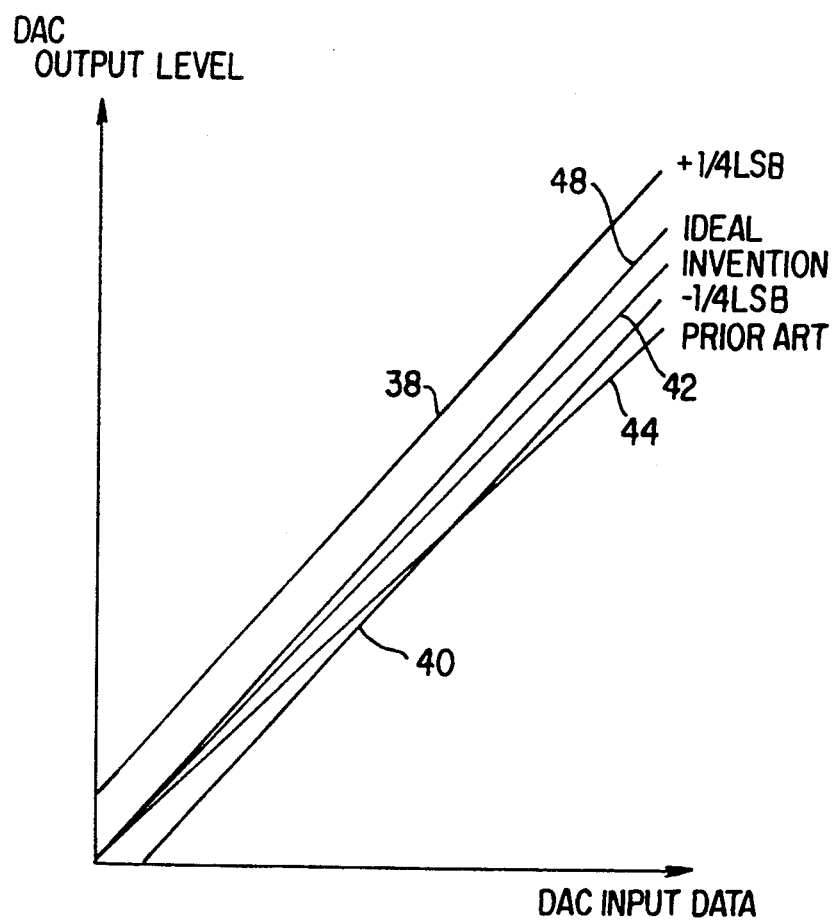
FIG. 4 is a graph showing a typical output to input characteristics for a conventional digital-to-analog converter compared with the ideal and with the characteristic achieved by the present invention.

In the current mirror circuits of the preferred embodiment of FIG. 5, the source terminals of transistor 28 and transistors 24, for a particular d/a converter, are connected to a common power line under identical conditions for application of the source voltage. Therefore the gate-source voltage VGS of transistor 28 is the same as that for each of transistors 24. The same current value (IDS) is therefore achieved in each of the transistors. In FIG. 4 the improvement over the prior art in terms of the output/input characteristics of the d/a converter is shown by comparing curve 42 to curve 44. The characteristic 42 is improved and is more likely to fall within an acceptable error range here shown to be plus or minus ¼ LSB at a high input data level.

As shown in FIG. 5, exclusive input-side transistors 28, 28' and 28" are provided in each of the d/a converters 18-1, 18-2 and 18-3. The output line is immediately distributed to respective gate terminals of the d/a converters. Thus, a noise filtering effect can be obtained by wiring resistance/capacitance 54/34 and 52/50 of the respective reference voltage VREF signal lines. Accordingly, even when one of the d/a converters operates and a power source noise varies the reference voltage VREF of the d/a converter as a result of noise injection into transistor 28 of the d/a converter, the reference voltage VREF to be applied to the other d/a converters is not significantly influenced. Furthermore, the noise filtering effect can suppress the fluctuation of the output due to PSRR (power supply rejection ratio) of an operational amplifier.

In FIG. 5 the reference voltage VREF is applied to each of the gate terminals of transistors 24 within the subcircuits 22. Therefore, the source-drain current (IDS) of transistors 24 has a preset value which is the same for each transistor 24.

Figure 6:
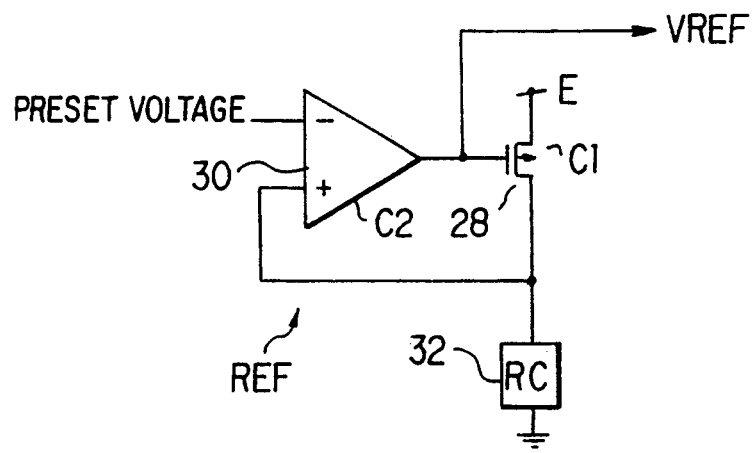
FIG. 6 is a circuit diagram of a portion of the circuit of FIG. 2.
Figure 1:
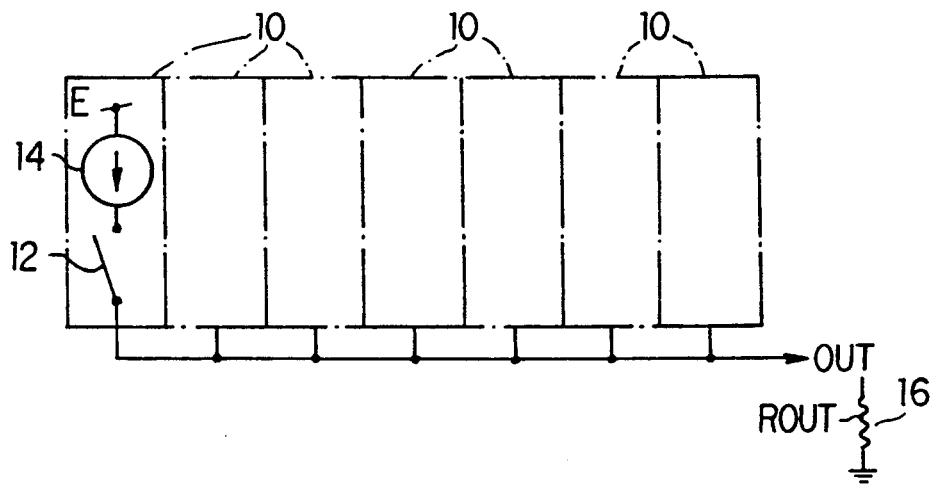
FIG. 1 is a block diagram of a prior art current-type digital-to-analog converter.
Figure 3:
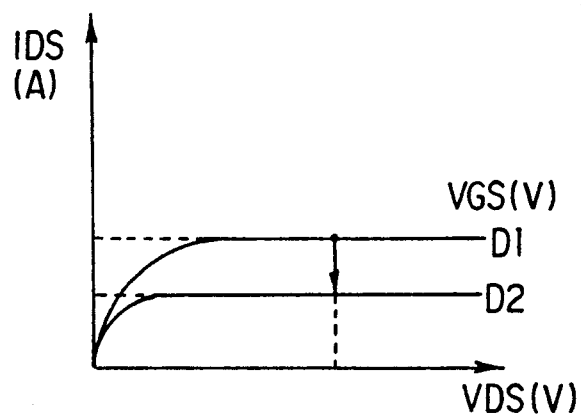
FIG. 3 is a typical curve showing the static voltage/current characteristics of a P channel MOS transistor.

FIG. 6 shows the reference voltage generating circuit 46 for producing gate reference voltage VREF in the prior art circuit of FIG. 2. A preset voltage is applied to the negative terminal of operation amplifier 30. A closed loop is constituted by the output of operational amplifier 30, P-channel MOS transistor 28, and the positive terminal of operational amplifier 30. Resistor 56 is provided between the drain of transistor 28 and ground so that transistor 28 can supply a preset reference current. Therefore, each current mirror circuit in d/a converter 18-1 is comprised of transistor 28 and a transistor 24 from each of the subcircuits. The gate reference voltage VREF produced by reference voltage generating circuit 46 is applied to the gate terminal of each transistor 24. From the resultant gate-source voltage VGS, a reference current source (drain current IDS) is generated for each transistor 24.

As described above, the present invention provides a digital-to-analog converting circuit which is provided with a current mirror circuit including reference voltage generating means, which is necessary for forming the d/a converter, and a reference current source within the d/a converter. This circuit can prevent the deterioration of the input/output linearity characteristics due to differences in common source supply voltage resulting from wiring impedance. Thus, any error in the linearity characteristics is much reduced and noise filtering is achieved.

Numerous modifications and variations of the present invention are possible in light of the above teachings. It is therefore to be understood that, within the scope of the appended claims, the present invention can be practiced in a manner other than as specifically described herein.

What is claimed is:

1. A digital-to-analog converter having input terminals for receiving digital data signals and output terminals for providing analog output signals, comprising:

means including a reference voltage source and a reference voltage transistor having a control terminal for providing a reference voltage in correspondence with a current through said reference voltage transistor, first circuit means including a first current source transistor and first switching means, wherein said first current source transistor has a conduction path and a control terminal connected to said control terminal of said reference voltage transistor and wherein said first switching means is connected in said conduction path of said first current source transistor, for selectively switching a current of said first current source transistor to said output terminals in correspondence with a first digital data signal; and second circuit means including a second current source transistor and second switching means, wherein said second current source transistor has a conduction path and a control terminal connected to said control terminal of said reference voltage transistor and wherein said second switching means is connected in said conduction path of said second current source transistor for selectively switching a current of said second current source transistor to said output terminals in correspondence with a second digital data signal;

wherein said reference voltage transistor is disposed a distance from said first circuit which is less than or equal to the distance between said first and second circuit means to reduce stray line effects and substantially equalize voltage condition for said first and second current source transistors and said reference voltage transistor.

2. The digital-to-analog converter of claim 1 wherein said reference voltage transistor, said first current source transistor and said second current source transistor are connected by a common source line to said reference voltage source.

3. A digital-to-analog converter having input terminals for receiving digital data signals and output terminals for providing analog output signals, comprising:

a power source having at least one power source line;

means, including a reference voltage source and a reference voltage transistor having a control terminal and a terminal connected to said power source line, for providing a reference voltage in correspondence with a current through said reference voltage transistor;

first circuit means including a first current source transistor and first switching means, wherein said first current source transistor has a terminal connected to said power source line, a drain terminal and a control terminal connected to said control terminal of said reference voltage transistor and wherein said first switching means is connected to said drain terminal of said first current source transistor for selectively switching a current of said first current source transistor to said output terminals in correspondence with a first digital data signal; and second circuit means including a second current source transistor and second switching means, wherein said second current source transistor has a terminal connected to said power source line, a drain terminal and a control terminal connected to said control terminal of said reference voltage transistor and wherein said second switching means is connected to said drain terminal of said second current source transistor for selectively switching a current of said second current source transistor to said output terminals in correspondence with a second digital data signal;

wherein said reference voltage transistor is located at a distance from said reference voltage source such that a gate-source voltage of said reference voltage transistor is substantially the same as a gate-source voltage of said first and second current source transistors.

4. A digital-to-analog converter having input terminals for receiving digital data signals and output terminals for providing analog output signals, comprising:

a power source having at least one power source line;

a reference voltage source;

a reference voltage transistor connected to said power source line and said reference voltage source;

a plurality of current source transistors, each connected to a control terminal of said reference voltage transistor and said power source line, for outputting current to said output terminals when in a conductive state; and a plurality of switching means, each connected to a respective one of said plurality of current source transistors and said input terminals, for selectively switching respective ones of said plurality of current source transistors to a conductive state in response to receipt of predetermined digital data signals;

wherein said reference voltage transistor is located a distance from said reference voltage source such that a gate-source voltage of said reference voltage transistor is substantially the same as gate-source voltages of each of said plurality of current source transistors.

5. A digital-to-analog converter having input terminals for receiving digital data signals and output terminals for providing analog output signals, comprising:

a power source having at least one power source line;

a reference voltage source; and a plurality of circuit means, each including;

a reference voltage transistor connected to one power source line and said reference voltage source;

a plurality of current source transistors, each connected to a control terminal of said reference voltage and said one power source line for outputting current to said output terminals when in a conductive state; and a plurality of switching means, each connected to a respective one of said plurality of current source transistors and said input terminals, for selectively switching respective ones of said plurality of current source transistors to a conductive state in response to receipt of a predetermined digital data signal;

wherein said reference voltage transistor is located a distance from said reference voltage source such that a gate-source voltage of said reference voltage transistor is substantially the same as gate-source voltages of each of said plurality of current source transistors.

* * * * *